June 29, 1971 K. RAITHEL ETAL 3,589,937

METHOD OF PRODUCING ELECTRIC SHUNTS FOR BRIDGING
P-N JUNCTIONS IN SEMICONDUCTORS
Filed Feb. 10, 1967

3,589,937
United States Patent Office
Patented June 29, 1971

3,589,937
METHOD OF PRODUCING ELECTRIC SHUNTS FOR BRIDGING P-N JUNCTIONS IN SEMICONDUCTORS

Kurt Raithel, Uttenreuth, and Rene Rosenheinrich, Ebermannstadt, Germany, assignors to Siemens Aktiengesellschaft Filed Feb. 10, 1967, Ser. No. 615,111
Claims priority, application Germany, Feb. 12, 1966, S 101,984
Int. Cl. H01l *7/02, 7/50;* H05k *3/06*
U.S. Cl. 117—212 3 Claims

ABSTRACT OF THE DISCLOSURE

Method of producing electric shunts for bridging p-n junctions in semiconductor bodies. A foil is placed on a semi-conductor body. This foil contains perforations in pattern. Surface of semiconductor body is etched away through perforations until p-n junction is destroyed.

Figure 1:
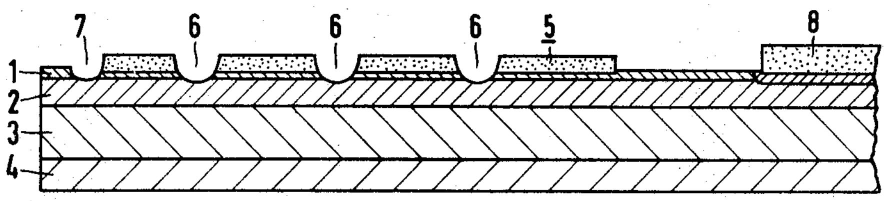

It is known to reduce the degree of amplification in a transistor by bridging the p-n junction between the base and the emitter, by a shunt. Thus, it is well known that the operation of thyristors, which act as two transistors connected in a specific way, may be stabilized by bridging the p-n junction between the controlled base and its neighboring emitter. This prevents a premature firing, which occurs upon an increase in operational temperature, because an increase of the leakage current of the p-n junction which initially blocks in forward direction.

The known methods for producing such shunts either produce a one-sided short circuit which, among other things, increases in an undesirable manner, the control current of the transistor or results in shunts of undefined conductivity which varies from case to case. Other known methods for making the p-n junction to be bridged, accessible in several places by etching and metallizing those places, do produce an exactly defined and reproducible result but require complicated masking process using the photo-resist method. This entails the disadvantage that the oxide mask used impairs the blocking capacity.

It is an object of this invention to produce by the simplest possible process exactly defined shunts in a form which affords a favorable operational effect and which are easy to reproduce.

The present invention relates accordingly to a method of producing electric shunts for bridging p-n junctions in semiconductors of electronic semiconductor components by a medium, which attacks the material of the semiconductors and using a mask of a material not affected by the medium, and used to coat portions of the semiconductor surface. According to the invention, the mask is provided with perforations distributed at least over a portion of its surface. Semiconductor material is removed up to the breakthrough of the p-n junction by a jet of the attacking medium directed toward the surface.

It is known to remove material from semiconductors, by means of sand blasts or jets of etching solution for example, in order to separate connected surface regions from semiconductors. In combination with a perforated mask, the same media may be advantageously used to produce the required fine breakthroughs which are necessary for the desired shunts. The shunts correspond to the perforations within the mask. The perforations are more or less uniformly distributed over the surface of the emitter region to be treated. The mask may be a simple synthetic foil, for example, polyvinyl chloride containing a pattern of small perforations on a surface area corresponding to the area of the emitter and is simply placed upon the semiconductor surface to be processed. The semiconductor may consist of silicon or germanium or an intermetallic compound of a known type.

The mask may also be a metal foil, for example of molybdenum. Gold foils are particularly favorable. The method is particularly simple when the emitter region is contacted with a gold foil which contains a doping addition, for example 0.5% antimony or boron, according to the conductance type of the emitter region. No special mask is then required for the production of the shunts. Rather, the gold foil contains the desired perforations and per se acts as the mask. One can even first alloy the gold foil into the semiconductor body, e.g. silicon, and thereby produce a perforated contact electrode which acts as a mask during the subsequent removal process. The alloy, which is essentially eutectic of gold and silicon, is resistant to a jet of etching solution as well as to sand blasting.

The number and size of the perforations are preferably so selected that their total area amounts at most to about 10% of the mask area having the perforations. Thus, to obtain a uniformly good penetration factor of the shunt, only a slight loss of useful emitter area needs to be taken into account contrary to the shunts produced according to the known methods which, in spite of a relatively great loss of emitter area, have only an insufficient shunt penetration factor.

Figure 2:
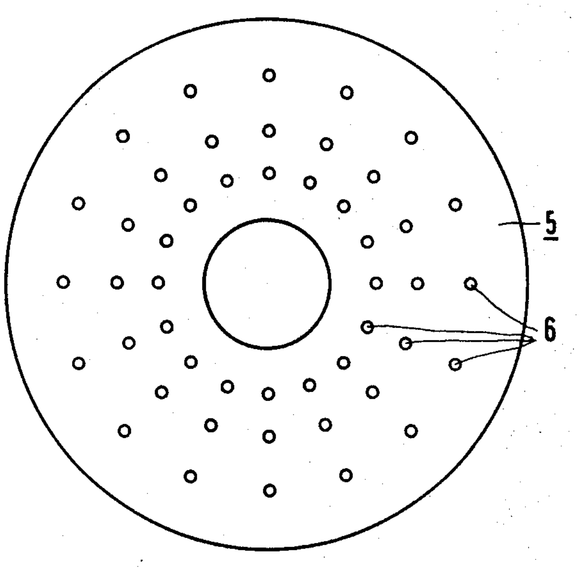

FIG. 1 illustrates schematically and in section one half of a four-layer arrangement with a perforated gold electrode; and FIG. 2 shows a top view upon the gold electrode, according to FIG. 1.

In FIG. 1, an n-conducting epitactic layer 1 is situated upon the p-conducting layer 2, below which are respective n- and p-conducting layers 3 and 4. The gold-antimony electrode 5 contacts the n-conductive layer 1 in a barrier-free manner. There are the 3 perforations 6 punched into the gold electrode 5. The final step in our invented method is illustrated in FIG. 1, wherein the portion of the epitactic layer lying beneath the holes 6, is removed by sand blasting or etching, up to the p-n junction. A ring-shaped margin separation 7 is located in the region of the epitactic layer 1 of the emitter which lies outside the covering of the gold electrode. In the center of the epitactic layer 1 is control electrode 8 produced from a gold foil, doped with boron. During the production of the shunts in the region of perforations 6 in layer 1, the non-contacted annular emitter surface between the contact electrode 5 and the control electrode 8, as well as the portion of the emitter surface positioned outside of the margin separation 7, are coated with a layer of varnish or with synthetic foils which are not attacked by the sand blasts or the etching solution. An example of such covering is PVC (polyvinyl chloride) films.

FIG. 2 shows the gold electrode 5 with 48 perforations on three concentric rings of uniformly distributed perforations 6. The number of concentric rings as well as their radial distance may be widely varied.

The invention will be further described with a numerical example in which the drawing described above is considered.

An approximately 27$\mu$ thick annular antimony-containing gold foil 5 of 14.5 mm. outside diameter and 3.6 mm. inside diameter, containing 48 perforations of 0.3 mm. diameter, i.e. one perforation to about each 3 mm.$^2$, and corresponding to an area loss of approximately 2.2%, was alloyed at about 720° C. over a period of between 5 and 10 minutes onto an approximately 20$\mu$ thick n-conducting emitter region 1 of a silicon thyristor element. The emitter region had been epitaxially produced and precipitated upon a p-conducting surface layer 2 of a monocrystalline silicon disc. The alloy electrode is treated by a sand blast which impinges uniformly upon the partially concealed electrode surface. Since under otherwise identical conditions, the depth of removal is a function of the treating period, a simple test with intermediate measuring procedures may establish exactly the time period for breaking through the p-n junction between the emitter region and the base region of opposite conductance type beneath it. Thus, the desired exactly defined shunt is produced through the disturbed surface structure of the exposed portions of the semiconductor surface.

If required, the shunt may be augmented by metallizing the exposed semiconductor surface. If, instead of sand blasting, an etching solution jet is used, then the exposed surface portions have an undisturbed surface structure. In this event, metallizing of the exposed semiconductor surfaces is absolutely necessary after the customery rinsing process. This metallizing process, which is also known, permits an exact dosing so that in this case also, the production of a defined shunt would not involve any difficulties. If the metallization process is carried out, for for example, by vapor depositing, then simple mechanical masks will suffice to protect the portions that are not to be affected by the metallization.

We claim:

1. A method of etching a silicon thyristor element so as to produce electric shunts for bridging p-n junctions therein by applying a Au-Sb alloy layer, said alloy layer having a plurality of perforations therein to form the desired hole pattern, applying a jet of etchant for the silicon base material and etching to the point of exposing said p-n junctions.

2. The method of claim 1, wherein the p-n junctions, exposed by the removal process, are metallized.

3. The method of claim 1, wherein the perforations have a diameter between 0.15 and 0.5 mm.

References Cited

UNITED STATES PATENTS

| | | | |
|---|---|---|---|
| 3,461,550 | 8/1969 | Aklufi | 29—578 |
| 3,140,527 | 7/1964 | Valdman et al. | 156—17X |
| 3,046,176 | 7/1962 | Bosenberg | 156—11 |
| 492,840 | 3/1893 | Scharling | 156—16X |
| 2,911,706 | 11/1959 | Wertwijn | 156—17X |
| 2,944,321 | 7/1960 | Westberg | 156—17X |

JACOB STEINBERG, Primary Examiner

U.S. Cl. X.R.

156—13, 16, 17; 29—578; 148—1.5